(12) United States Patent
Jin et al.

(10) Patent No.: US 7,657,237 B2
(45) Date of Patent: Feb. 2, 2010

(54) METHOD AND SYSTEM TO IMPROVE TRANSMITTER LINEARIZATION

(75) Inventors: Hang Jin, Plano, TX (US); Jing Jiang, Allen, TX (US); John Grabner, Plano, TX (US)

(73) Assignee: Cisco Technology, Inc., San Jose, CA (US)

( * ) Notice: Subject to any disclaimer, the term of this patent is extended or adjusted under 35 U.S.C. 154(b) by 409 days.

(21) Appl. No.: 11/633,220

(22) Filed: Dec. 4, 2006

(65) Prior Publication Data
US 2007/0129027 A1    Jun. 7, 2007

Related U.S. Application Data

(60) Provisional application No. 60/748,567, filed on Dec. 7, 2005.

(51) Int. Cl.
*H04B 1/04* (2006.01)
*H04Q 7/20* (2006.01)

(52) U.S. Cl. .................................... 455/114.3; 375/296

(58) Field of Classification Search .............. 455/114.3, 455/126; 375/296–297
See application file for complete search history.

(56) References Cited

U.S. PATENT DOCUMENTS

| 2002/0101937 | A1 | 8/2002 | Antonio et al. | |
|---|---|---|---|---|
| 2003/0035494 | A1* | 2/2003 | Bauder et al. | 375/296 |
| 2003/0076894 | A1 | 4/2003 | Jin et al. | |
| 2003/0119462 | A1* | 6/2003 | Ben-Ayun et al. | 455/138 |
| 2004/0116083 | A1 | 6/2004 | Suzuki et al. | |
| 2006/0078065 | A1* | 4/2006 | Cai et al. | 375/297 |

OTHER PUBLICATIONS

PCT International Search Report and Written Opinion in counterpart International Application No. PCT/US2006/047063, dated Nov. 3, 2008.

* cited by examiner

*Primary Examiner*—Lee Nguyen

(57) ABSTRACT

A method and system are provided to compensate for the nonlinearity of a wireless transmitter. The method includes sending a predetermined input bit stream to the power amplifier, calculating the coefficients of the polynomial representing the response curve of the power amplifier and generating the predistortion coefficients of the polynomial representing the response curve of the predistortor. The method linearizes the response curve of the transmitter chain in a communication device.

13 Claims, 4 Drawing Sheets

100

METHOD AND SYSTEM TO IMPROVE TRANSMITTER LINEARIZATION

CROSS REFERENCE

The present application claims the benefit of U.S. Provisional Application Ser. No. 60/748,567, which was filed on Dec. 7, 2005.

BACKGROUND

Certain designs of power amplifiers (PAs) of a transmitter chain in a communication system employ non-constant envelope modulation techniques to improve the bandwidth efficiency. In order to preserve the signal shape, the non-constant envelope modulation techniques require linear amplification. However, linear amplification is possible only when the power amplifier is operated with a small input signal, which in turn makes the amplifier least efficient. The nonlinear characteristic of the power amplifier makes it difficult to achieve power efficiency and bandwidth efficiency simultaneously.

Many techniques have been developed to improve the linearity of the PA in the transmitter chain. Three main categories of these techniques are feedforward, feedback, and predistortion.

Feedforward techniques are more expensive and less efficient than feedback techniques. The feedback linearization technique can be applied directly around the RF amplifier or indirectly upon the modulation.

Two well-known feedback techniques are Cartesian feedback and polar-loop feedback. The Cartesian feedback technique involves the suppression of nonlinearity in a complex-baseband, expressed by using rectangular Cartesian coordinates, so that it can reduce the shortcomings of quadrature modulators. However, it requires a large amount of memory to store the table of 2-dimensional coefficients for the I-Q data. Another disadvantage of the Cartesian feedback technique is the difficulty in implementing local phase control for the quadrature modulator and demodulator.

In the polar-loop feedback technique, the RF signal is directly generated by a voltage-controlled oscillator whose phase is controlled by feedback signals and whose amplitude is modulated by the difference between a reference signal and a feedback signal. The issues that complicate the design of polar-loop feedback are as follows: First, it requires a precision receiver within the transmitter; second, the control loop bandwidth greatly exceeds the signal bandwidth; third, it restricts the dynamic range of output power and lastly, the maintainability of the stability of the feedback loop is complex tricky.

As such, what is desired is a system and method for improving the transmission linearization that costs less and is easy to implement.

SUMMARY

Described herein are a system and method to compensate for the nonlinearity of the wireless transmitter. The method includes sending a predetermined input bit stream to the power amplifier, calculating the coefficients of the polynomial representing the response curve of the power amplifier and generating the predistortion coefficients of the polynomial representing the response curve of the baseband predistortor. The method linearizes the response curve of the transmitter chain of a wireless station.

DESCRIPTION

Described herein are a system and method to compensate for the nonlinearity introduced by a power amplifier (PA) and the band limiting devices in the transmitter chain of a wireless station. It is a general understanding that a wireless station is referred to as either a mobile terminal or a fixed terminal such as a base station.

The present system includes a baseband predistortor in conjunction with a linear-phase prefilter, to improve transmitter lineralization. A basic concept of the predistortion techniques involves an insertion of a nonlinear element, a baseband predistortor, prior to the PA, which compensates for the nonlinearity of the PA. In the present system, the linear-phase prefilter filters out the signal around the transmitter passband edge and subsequently reduces its out-of-band spectral regrowth, caused by the nonlinear phase of transmit filtering.

A semi-analytical method is also provided that characterizes the nonlinearity of the PA and generates a transfer function for the baseband predistortor. The linearity of the transmitter chain is further improved with an optimization method disclosed herein.

Figure 1:
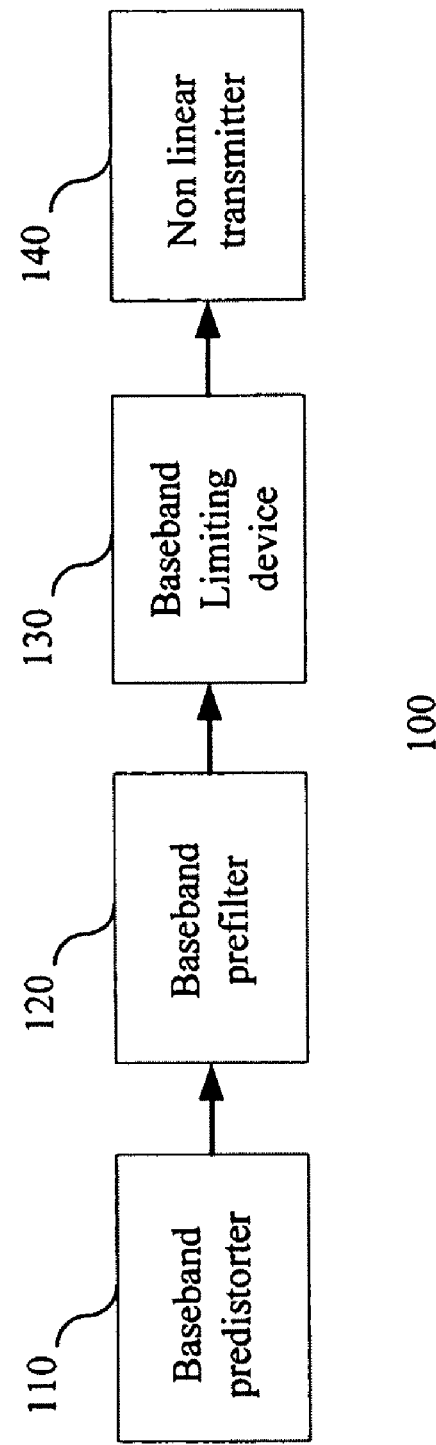
FIG. 1 shows a transmitter model with a baseband predistorter and a prefilter.

FIG. 1 shows a transmitter chain model 100, which comprises four modules: a baseband predistorter 110, a baseband prefilter 120, a band limiting device 130, and a nonlinear transmitter 140. The baseband predistorter 110 may be implemented as a simple AM-AM (amplitude distortion) baseband predistorter. The nonlinear transmitter 140 includes the PA and its supplementary components. The transfer function of each module is described in the foregoing figures.

Figure 2:
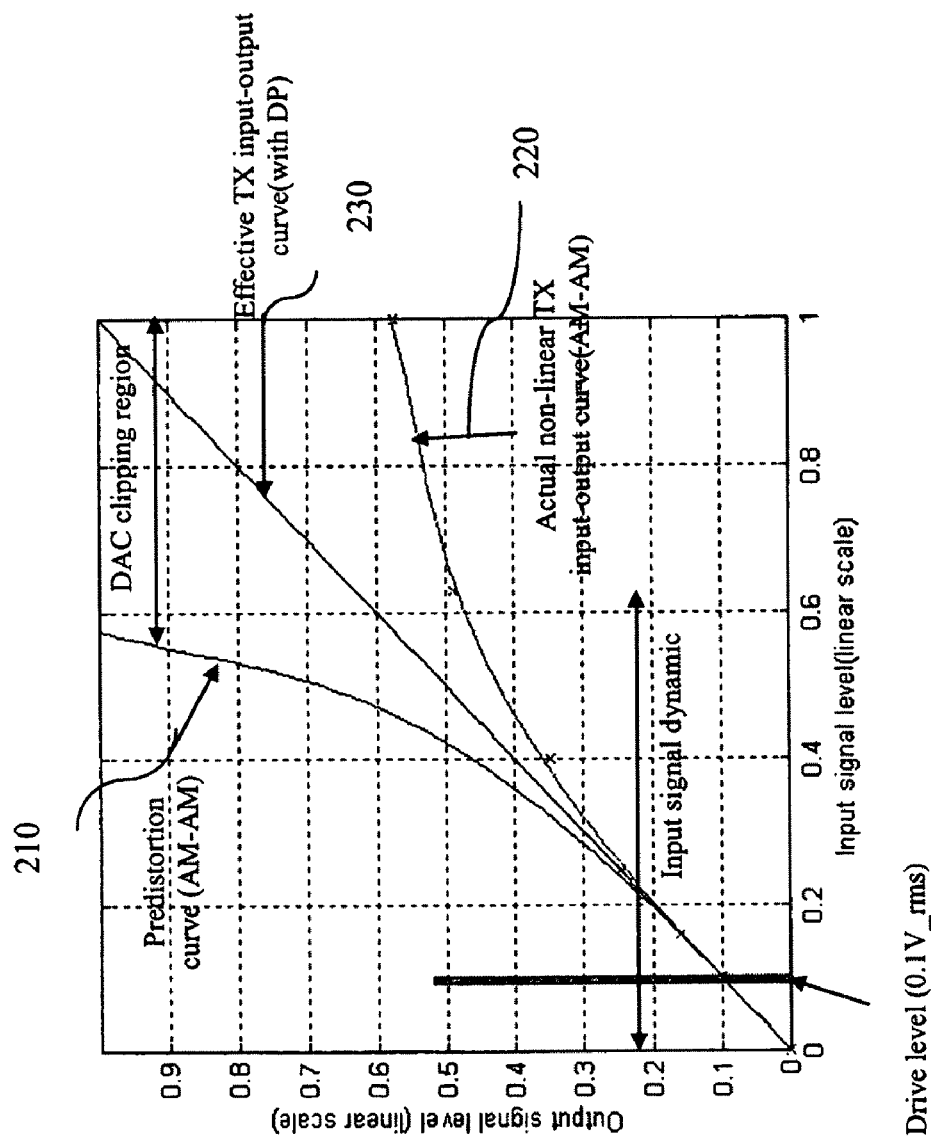
FIG. 2 shows a typical transmit input-output (AM-AM) curve with an input signal dynamic and DAC (Digital-to-Analog Converter) clipping region.

A transfer function 210 of the baseband predistorter 110 is shown in FIG. 2.

FIG. 2 shows a typical transmit input-output (AM-AM) curve with an input signal dynamic and DAC (Digital-to-Analog Converter) clipping region. The baseband predistorter 110 has the input-output response curve 210, which is the inverse of the input-output response curve 220 of the nonlinear transmitter 140. The transfer function of these two combined modules, the overall input-output response curve 230, at the output stage of the nonlinear transmitter is linear.

Let $TX_{in}$ and $TX_{out}$ denote the input and output signals of the nonlinear transmitter 140 correspondingly. Assuming that $TX\_F(\ldots)$ represents the transfer function of the nonlinear transmitter 140, $TX_{out}=TX\_F(TX_{in})$ (1).

Assume a baseband predistortor (DP) has the transfer function $DP_{out}=DP\_F(DP_{in})$ (2), where $DP\_F(\ldots)$ is the inverse function of the transfer function $TX\_F(\ldots)$, where $DP\_F=TX\_F^{-1}$ (3).

The transfer function $TX\_F(\ldots)$ can be expanded into a polynomial, in which only the odd terms impact out-of-band transmitting emissions. The transmitting emissions generated by even terms are far away from the signal spectrum and will be filtered out by the transmitting harmonic filters.

The response curve of nonlinear transmitter 220 can be approximated by the following polynomial:

$$V_{out} = G_v \cdot V_{in} \cdot \left[1 + \sum_{i=1}^{N} A_i \cdot V_{in}^{2i} + \sum_{i=1}^{N} B_i \cdot V_{in}^{2i-1}\right], \quad (4)$$

where $V_{out}$ and $V_{in}$ are the output and input voltages of the transmitter, respectively. $G_v$ is the small signal gain (linear gain). In equation 4, only odd-term coefficients $A_i$ can be characterized by the measuring of inter-modulation or adjacent channel power (ACP). The even-term coefficients $B_i$ are unknown and cannot be measured.

Module 120 in FIG. 1 shows the baseband prefilter. The linear-phase prefilter is added to the baseband predistorter to filter out the signal around the transmit passband edge. The effective out-of-band emission around passband edges of the transmitter model described in FIG. 1 is the same as the transmitter using a technique without predistortion. Module 130 in FIG. 1 shows the band limiting devices (filters) in the transmitter chain.

The effectiveness of the predistortion technique realized by the transmitter model, described in FIG. 1, depends on the accurate estimation of the response curve of the PA in the nonlinear transmitter 140. A most straightforward approach to characterize the response curve of the PA is to drive the PA into linear and saturated regions and record the input-output response curve. However, two issues arise with this approach.

First, regulations of a regulatory authority, such as the FCC in the United States, do not allow the PA to operate in the saturated region with continuous waveform (CW) tones. Second, even if the input signal drives the PA into the saturated region and the response curve is recorded, it is still difficult to extract the odd terms, which are required by the predistortion technique, from the polynomial that approximates the nonlinear response curve of the PA. The present semi-analytical method characterizes the nonlinearity of the PA.

Figure 3:
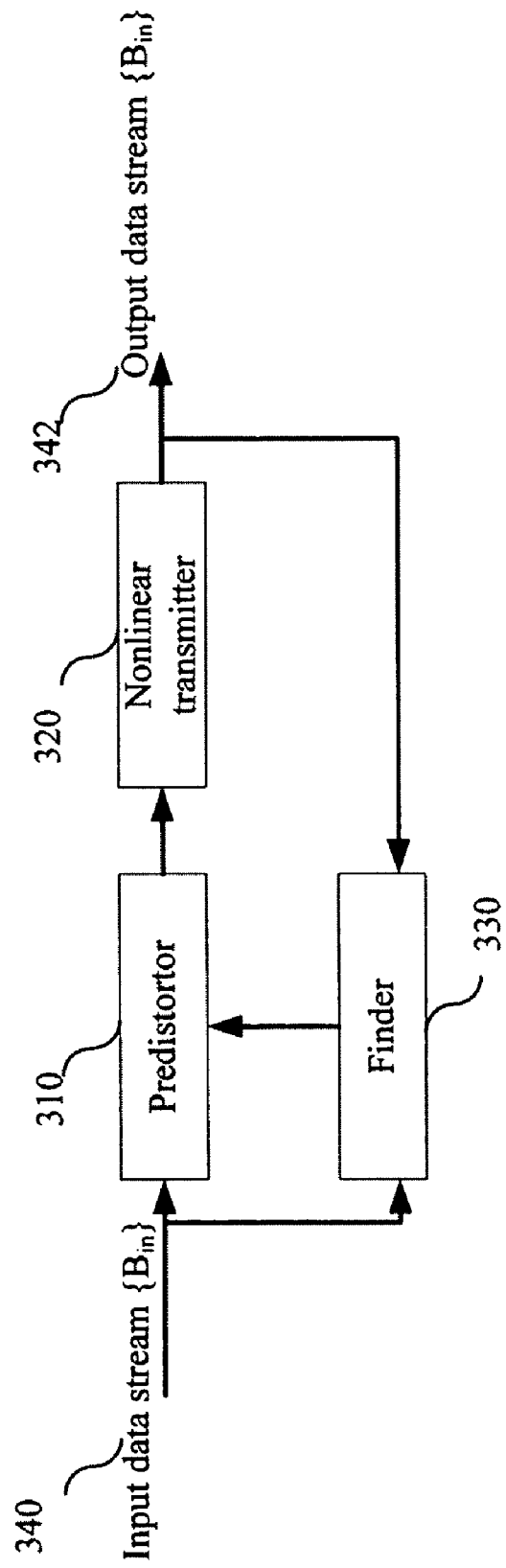
FIG. 3 is a block diagram that shows a setup of a transmitter chain.

FIG. 3 is a block diagram that shows the setup of a transmitter chain that employs the semi-analytical method to characterize the nonlinearity of the PA according to an embodiment. When the input-output response curve of the PA is approximated by the polynomial described in equation 4, then the coefficients $A_i$ of the odd terms in the polynomial can be determined as follows.

A known bit stream $\{b_{in}\}$ is sent to a nonlinear transmitter 320 via a baseband predistortor 310 and a finder 330. The output of the nonlinear transmitter 320 is a bit stream $\{b_{out}\}$. In the initial stage, the response curve of the baseband predistortor 310 is flat, i.e. the bit stream output from the baseband predistortor 310 is the same as the input bit stream $\{b_{in}\}$ in the first pass.

The finder 330 applies the Fast Fourier Transform (FFT) operation on both input and out bitstreams $\{b_{in}\}$ and $\{b_{out}\}$. The coefficients $A_i$ of the odd terms in the polynomial that approximate the response curve of nonlinear transmitter 320 can be calculated according to the following equation:

$\{m_{ij}\}*\{A_i\} = \{F_i\}$, $i=1, \ldots, NF$, $j=0, \ldots, N$; $NF \geq N$ (5), wherein $m_{ij}=FFT\{(b_{in})^{2j+1}\}|_{f_i}$ and $F_i=FFT\{(b_{out})\}|f_i$ with $FFT\{\,\}|f_i$ denoting FFT evaluation at $f_i$. The frequencies $\{f_i\}$ should be evenly distributed across the transmitting spectrum.

The response curve of baseband predistortor 210 in FIG. 2 can be approximated by the following polynomial, $$V'_{in} = V_{in} \cdot \left[1 + \sum_{j=1}^{N} a_j \cdot V_{in}^{2j}\right], \quad (7)$$

where $V'_{in}$ and $V_{in}$ are the output and input voltages of the baseband predistorter 310, respectively, and $a_j$ are the predistortion coefficients of the polynomial approximating the response curve of the baseband predistorter. Note that only the odd terms in equation (7) are retained. This is due to the fact that only the odd-term coefficients $A_i$ in the polynomial of equation (4) approximating the response curve of the PA are necessary.

A following new equation is obtained by substituting $V'_{in}$ in equation (7) into $V_{in}$ in equation (4) and retaining only odd terms.

$$V_{out} = G_v \cdot V_{in} \cdot \left[1 + \sum_{j=1}^{N} a_j \cdot V_{in}^{2j}\right] \cdot \left[1 + \sum_{i=1}^{N} A_i \cdot \left(V_{in} \cdot \left[1 + \sum_{j=1}^{N} a_j \cdot V_{in}^{2j}\right]\right)^{2i}\right]. \quad (8)$$

Expand equation (8) lets the coefficients of the first N (N>1) odd terms equal to zero. $F(a,A)=0$ (9), where $a=[a_1, a_2, \ldots, a_N]$ and $A=[A_1, A_2, \ldots, A_N]$. Equation (9) shows a mathematical relationship between A and a. An approximation solution for equation (9) is given as follows: $a=-A$. (10)

The finder 330 forwards the predistortion coefficients a to baseband predistortor 310. The transfer function of baseband predistortor 310 has a response curve that closely approximates response curve 210.

To further refine the approximation solution, the procedure of characterizing the nonlinearity of the PA and generating the predistortion coefficients continues until the difference in the predistortion coefficients a between two consecutive iterations is less than a threshold or until the number of iterations exceeds a certain amount.

Figure 4:
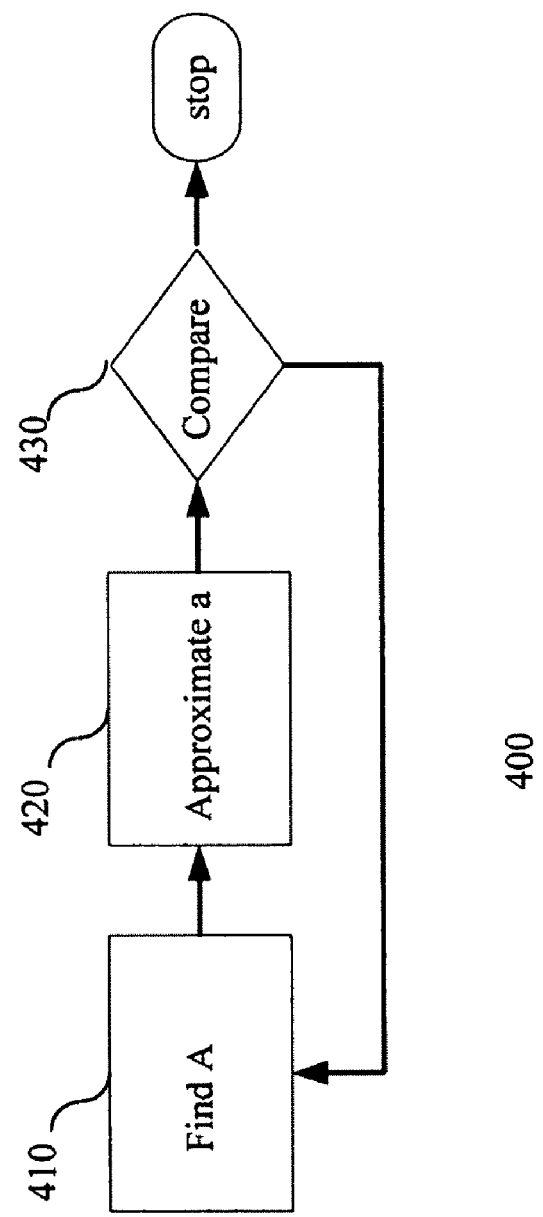
FIG. 4 is a flow chart showing an optimization method for computing the predistortion coefficients.

FIG. 4 is a flow chart showing an optimization of the predistortion coefficients a according to the embodiment of the present invention. In step 410, the coefficients $A_i$ of the odd terms in the polynomial that approximates the response curve of the nonlinear transmitter are calculated according to the procedure described above.

In step 420, the predistortion coefficients of the odd terms in representing the response curve of the baseband predistortor are approximated according to equation (9).

In step 430, the predistortion coefficients between two consecutive iterations are compared. If the difference in the predistortion coefficients a is less than a threshold or the number of iterations exceeds a certain amount, then the process ends. Otherwise, the same process is repeated by going back to step 410.

One of the embodiments of the input bit stream $\{b_{in}\}$ in the semi-analytical method is constructed from two CW tones, i.e. $\{b_{in}\}=\{\sin(\omega_1 t)+\sin(\omega_2 t)\}$ (6). The benefit of using a two-tone test vector is that its FFT spectrum has peaks at inter-modulation frequencies that can be easily detected. The frequencies of the two CW tones are separated by slightly larger than 100 KHz, for example, 105 KHz.

The signal level of the CW is set in such a way that for each tone, the input signal level at the antenna input port is less than (63−17)−10log$_{10}$(60)=28 dBm, which is a regulatory threshold, such as an FCC requirement. By doing so, the total signal level of the two CW tones is 31 dBm and is high enough to drive the PA into the nonlinear region.

A system and a method are provided to compensate for the nonlinearity of the wireless transmitter. The present system incurs less overall costs than the conventional system and the simplicity of the present method reduces the complexity in implementing sophisticated algorithms for estimating amplifier nonlinearity.

The present system combines the functions of a baseband predistorter and a prefilter. The transmitter chain with a baseband predistorter and a prefilter suppresses the out-of-band spectral regrowth more efficiently than the conventional transmitter chain and improves the efficiency of the PA.

The semi-analytical method described herein is easy to implement. This method uses two-tone test vectors to characterize the nonlinearity of the PA and an iterative optimization procedure to optimize the PA output.

The method described herein is applicable to any system that has a low-efficient nonlinear PA and a nonlinear-phase transmit filter. If feedback exists between the PA output and input, the method can also be employed to adjust the baseband predistorter and the prefilter.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method comprising:
   providing a transmitter having a baseband predistortor in a signal path of the transmitter, wherein a polynomial function represents a response curve of the transmitter;
   estimating one or more coefficients of the polynomial function of the response curve of the transmitter by:
     sending a predetermined input bit stream through the signal path, wherein the predetermined input bit stream is formed by at least two continuous wave tones, a signal level of each of the two continuous wave tones being less than a regulatory threshold but such that a total signal level of the two continuous wave tones combined being sufficient to drive a power amplifier in the transmitter into a nonlinear operating mode;
     applying a Fast Fourier Transform (FFT) operation to the predetermined input bit stream and to an output bit stream from the signal path that results from the predetermined input bit stream; and
     computing coefficients of the polynomial function based on results from the FFT operation applied to the predetermined input bit stream and to the output bit stream;
   computing predistortion coefficients for the baseband predistorter based on the one or more coefficients of the polynomial function.

2. The method of claim 1, wherein providing comprises providing the transmitter that comprises a prefilter.

3. The method of claim 2, wherein providing comprises providing the transmitter that comprises a baseband limiting device between the prefilter and the power amplifier.

4. A method comprising:
   providing a transmitter having a baseband predistorter in a signal path of the transmitter, wherein a polynomial function represents a response curve of the transmitter;
   estimating one or more coefficients of the polynomial function for the response curve of the transmitter by:
     sending a predetermined input bit stream through the signal path;
     applying a Fast Fourier Transform (FFT) operation to the predetermined input bit stream and to an output bit stream from the signal path that results from the predetermined input bit stream, according to a mathematical representation
     $\{m_{ij}\}*\{A_i\}=\{F_i\}$, i=1, ..., NF, j=0, ..., N; NF≧N, where $A_i$ are the one or more coefficients of the polynomial function representing the response curve of the transmitter, $B_{in}$ is the predetermined input bit stream, $b_{out}$ is the output bit stream from the transmitter, $m_{ij}$=FFT$\{(b_{in})^{2j+1}\}|f_i$ and $F_i$=FFT$\{(b_{out})\}|f_i$ with FFT$\{\ \}|f_i$ s denoting FFT evaluation at $f_i$; and
   computing predistortion coefficients for the baseband predistortor based on the one or more coefficients of the polynomial function for the response curve of the transmitter.

5. The method of claim 4, wherein computing the predistortion coefficients further comprises applying an inverse function to the one or more coefficients for the polynomial function representing the response curve of the power amplifier.

6. The method of claim 5, and further comprising iteratively repeating said sending, applying, and computing predistortion coefficients to revise the predistortion coefficients until a difference in the predistortion coefficients between two consecutive iterations is less than a threshold or until the number of iterations exceeds a certain amount.

7. A method comprising:
   sending a predetermined input bit stream to a power amplifier of a communication device, wherein the predetermined bit stream comprises at least two continuous wave tones, a signal level of each of the two continuous wave tones being less than a regulatory threshold but such that a total signal level of the two continuous wave tones combined being sufficient to drive the power amplifier into a nonlinear operating mode;
   calculating coefficients of a polynomial function representing the response curve of the power amplifier based on the predetermined input stream and an output bit stream of the power amplifier resulting from the predetermined input bit stream; and
   generating predistortion coefficients for a baseband predistortor from the coefficients for the polynomial function representing the response curve of the power amplifier so as to achieve an overall linear response of a transmitter in the communication device that comprises the baseband predistortor and the power amplifier.

8. A method comprising:
   sending a predetermined input bit stream to a power amplifier of a communication device;
   computing one or more coefficients of a polynomial function representing a response curve of the power amplifier based on the predetermined bit stream and an output bit stream of the power amplifier resulting from the predetermined input bit stream, wherein computing comprises applying a Fast Fourier Transform (FFT) operation to the predetermined bit stream and to the output bit stream according to a mathematical representation $\{m_{ij}\}*\{A_i\}=\{F_i\}, i=1,\ldots,NF, j=0,\ldots,N; NF \geq N$, where $A_i$ are the one or more coefficients of the polynomial representing the response curve of the power amplifier, $b_{in}$ is the predetermined input bit stream, $b_{out}$ is the output bit stream from the power amplifier, $m_{ij}=FFT\{(b_{in})^{2j+1}\}|f_i$ and $F_i=FFT\{(b_{out})\}|f_i$ with $FFT\{\ \}|f_i$ denoting FFT evaluation at $f_i$; and computing based on the one or more coefficients of the polynomial function predistortion coefficients for a baseband predistortor that is in a signal path of a transmitter comprising the power amplifier and the baseband predistorter.

9. The method of claim 8, wherein generating computing the predistortion coefficients of the baseband predistortor further comprises applying employing an inverse function to the one or more coefficients for the polynomial function representing the response curve of the power amplifier.

10. The method of claim 9, and further comprising iteratively repeating said sending, computing coefficients of the polynomial function and computing predistortion coefficients to revise the predistortion coefficients until a difference in the predistortion coefficients between two consecutive iterations is less than a threshold or until the number of iterations exceeds a certain amount.

11. An apparatus comprising:
a power amplifier;
a predistortor configured to be coupled in a signal path of the power amplifier, wherein the predistortor applies predistortion to a signal in the signal path according to a polynomial function represented by one or more predistortion coefficients;
a coefficient estimation module configured to generate the predistortion coefficients based on one or more coefficients for a polynomial function that represents a response curve of the power amplifier, wherein the one or more coefficients for the polynomial function for the response curve of the power amplifier are computed from a predetermined bit input bit stream supplied through the signal path and a resulting output bit stream, wherein the predetermined input bit stream comprises at least two continuous wave tones, a signal level of each of the two continuous wave tones being less than a regulatory threshold but such that a total signal level of the two continuous wave tones combined being sufficient to drive a power amplifier in the transmitter into a nonlinear operating mode, and wherein the one or more coefficients for the response curve of the transmitter are computed from results of an Fast Fourier Transform (FFT) operation applied to the predetermined input bit stream and the output bit stream.

12. The transmitter of claim 11, wherein the transmitter further comprises a linear phase prefilter coupled in the signal path in front of the power amplifier and a baseband limiting device in the signal path between the prefilter and the power amplifier.

13. The transmitter of claim 11, wherein the coefficient estimation module is configured to generate the predistortion coefficients by iteratively:
applying the FFT operation to the predetermined input bit stream and the output bit stream of the power amplifier to obtain the one or more coefficients of the polynomial representing the response curve of the power amplifier;
applying an inverse function to one or more coefficients for the polynomial representing the response curve of the power amplifier; and
revising the predistortion coefficients until a difference in the predistortion coefficients between two consecutive iterations is less than a threshold or until the number of iterations exceeds a certain amount.

* * * * *

UNITED STATES PATENT AND TRADEMARK OFFICE
CERTIFICATE OF CORRECTION

| | | |
|---|---|---|
| PATENT NO. | : 7,657,237 B2 | Page 1 of 1 |
| APPLICATION NO. | : 11/633220 | |
| DATED | : February 2, 2010 | |
| INVENTOR(S) | : Hang Jin et al. | |

It is certified that error appears in the above-identified patent and that said Letters Patent is hereby corrected as shown below:

Column 8, line 15, replace "The transmitter" with -- The apparatus --; and line 20, replace "The transmitter" with -- The apparatus --.

Signed and Sealed this

Twenty-eighth Day of September, 2010

David J. Kappos
*Director of the United States Patent and Trademark Office*

UNITED STATES PATENT AND TRADEMARK OFFICE
CERTIFICATE OF CORRECTION

| | |
|---|---|
| PATENT NO. | : 7,657,237 B2 |
| APPLICATION NO. | : 11/633220 |
| DATED | : February 2, 2010 |
| INVENTOR(S) | : Jin et al. |

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 469 days.

Signed and Sealed this

Twenty-eighth Day of December, 2010

David J. Kappos
*Director of the United States Patent and Trademark Office*